US006936529B2

(12) United States Patent
Lim et al.

(10) Patent No.: US 6,936,529 B2
(45) Date of Patent: Aug. 30, 2005

(54) METHOD FOR FABRICATING GATE-ELECTRODE OF SEMICONDUCTOR DEVICE WITH USE OF HARD MASK

(75) Inventors: Kwan-Yong Lim, Ichon-shi (KR); Heung-Jae Cho, Ichon-shi (KR); Jung-Ho Lee, Ichon-shi (KR); Se-Aug Jang, Ichon-shi (KR); Yong-Soo Kim, Ichon-shi (KR); Byung-Seop Hong, Ichon-shi (KR); Jae-Geun Oh, Ichon-shi (KR); Hong-Seon Yang, Ichon-shi (KR); Hyun-Chul Sohn, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/725,320

(22) Filed: Dec. 2, 2003

(65) Prior Publication Data

US 2004/0266151 A1 Dec. 30, 2004

(30) Foreign Application Priority Data

Jun. 30, 2003 (KR) .............................. 10-2003-0043087

(51) Int. Cl.[7] .................. H01L 21/4763; H01L 21/3205
(52) U.S. Cl. ...................... 438/585; 438/211; 438/184; 438/230; 438/595; 438/257; 438/645; 438/706
(58) Field of Search ............................... 438/585, 211, 438/184, 230, 595, 257, 645, 706

(56) References Cited

U.S. PATENT DOCUMENTS 4,149,307 A * 4/1979 Henderson ................... 438/301
6,013,569 A 1/2000 Lur et al.
6,066,545 A 5/2000 Doshi et al.
6,319,772 B1 11/2001 Tee et al.
6,392,270 B1 * 5/2002 Tanimoto et al. ........... 257/316
6,573,132 B1 * 6/2003 Uehara et al. .............. 438/211
6,689,650 B2 * 2/2004 Gambino et al. ........... 438/157
2002/0086507 A1 * 7/2002 Park et al. .................. 438/585

FOREIGN PATENT DOCUMENTS

EP        1065715 A2    1/2001    ....... H01L/21/8249

* cited by examiner

Primary Examiner—B. William Baumeister
Assistant Examiner—Igwe U. Anya
(74) Attorney, Agent, or Firm—Mayer, Brown, Rowe & Maw LLP

(57) ABSTRACT

The present invention relates to a method for fabricating a gate electrode of a semiconductor device with a double hard mask capable of preventing an abnormal oxidation of a metal layer included in the gate electrode and suppressing stress generation. The method includes the steps of: forming a gate insulation layer on a substrate; forming a gate layer structure containing at least a metal layer on the gate insulation layer; forming a hard mask oxide layer on the gate layer structure at a temperature lower than an oxidation temperature of the metal layer; forming a hard mask nitride layer on the hard mask oxide layer; patterning the hard mask oxide layer and the hard mask nitride layer as a double hard mask for forming the gate electrode; and forming the gate electrode by etching the gate layer structure with use of the double hard mask as an etch mask.

14 Claims, 8 Drawing Sheets

METHOD FOR FABRICATING GATE-ELECTRODE OF SEMICONDUCTOR DEVICE WITH USE OF HARD MASK

FIELD OF THE INVENTION

The present invention relates to a method for fabricating a semiconductor device; and, more particularly, to a method for fabricating a gate electrode of a semiconductor device with use of a hard mask.

DESCRIPTION OF RELATED ARTS

A current trend in large-scale of integration of a semiconductor device leads to a decrease in an applicable thickness of a photoresist. However, this decreased thickness of the photoresist causes a selectivity ratio of the photoresist during a patterning process to be decreased. Thus, a hard mask is adopted in various etching processes to solve the above described problem.

In a memory device like dynamic random access memory (DRAM), such a nitride layer made of $Si_3N_4$ is usually used in the patterning process. The reasons for employing the nitride layer are because it allows the etching process to be performed more easily than the patterning process using only the photoresist and a self-aligned contact (SAC) process, which is an essential process for fabricating the semiconductor device, can be also applicable. Especially, as a line-width of a gate electrode is decreased to below about 100 nm, a spacing distance between the gate electrodes becomes sharply narrower, resulting in a loading effect during a SAC etching process. This loading effect becomes a factor for decreasing process margins. Therefore, the hard mask is required to be thick to improve the process margins. Herein, the loading effect includes a problem of etching a bottom layer in addition to a target etching layer. For instance, in case of forming a hard mask on an upper surface of a gate electrode, an etching of a contact damages the hard mask, and thus, the gate electrode and the contact get shorted.

FIGS. 1A and 1B are cross-sectional views illustrating a conventional method for fabricating a gate electrode with use of a single hard mask.

Referring to FIG. 1A, a gate insulation layer 12 is formed on a substrate 11. A polysilicon layer 13, a tungsten nitride layer 14 and a tungsten layer 15 are sequentially stacked on the gate insulation layer 12. Then, a hard mask nitride layer 16 is deposited on the tungsten layer 15, and a photosensitive pattern 17 for patterning a gate electrode is formed on the hard mask nitride layer 16.

Referring to FIG. 1B, the hard mask nitride layer 16 is then etched with use of the photosensitive pattern 17 as an etch mask to form a hard mask nitride layer pattern 16A, and the photosensitive pattern 17 is removed thereafter. Subsequently, the tungsten layer 15, the tungsten nitride layer 14 and the polysilicon layer 13 are sequentially etched by using the hard mask nitride layer pattern 16A as an etch mask so as to form a polymetal gate electrode including sequentially stacked the polysilicon layer 13, the tungsten nitride layer 14 and the tungsten layer 15.

Especially, the hard mask nitride layer 16 has a thickness over about 1500 Å to secure a process margin of a subsequent SAC etching process. However, the use of the thick hard mask nitride layer 16 becomes a factor for generating stress during a subsequent thermal process, further resulting in a problem of degrading properties of a metal-oxide semiconductor field-effect transistor (MOSFET).

FIG. 2 is a diagram showing a comparison between stress induced leakage current (SILC) levels in the absence or presence of a hard mask nitride layer. Herein, the reference symbol S1 represents a first sample, wherein a hard mask nitride layer is deposited on an upper surface of a gate electrode formed by stacking a polysilicon layer, a tungsten nitride layer and a tungsten layer. The reference symbol S2 represents a second sample, wherein the hard mask nitride layer is not formed on the above gate electrode. The reference symbol S3 represents a third sample, wherein the hard mask is not formed on a gate electrode formed with only the polysilicon layer.

As shown, the SILC of the first sample S1 is higher than those of the second sample S2 and the third sample S3.

FIG. 3 is a diagram showing a comparison between interface trap densities ($D_{it}$) of the first sample S1, the second sample S2 and the third sample S3. Herein, the interface trap density is the density of a trap between a gate insulation layer and a substrate.

As shown, the interface trap density of the first sample is higher than those of the second sample S2 and the third sample S3.

Based on FIGS. 2 and 3, it is discovered that a higher level of stress induced by the hard mask nitride layer degrades characteristics of a device.

Therefore, it is contrived to use a double hard mask to reduce the stress generated by employing solely the thick hard mask.

FIG. 4 is a cross-sectional view showing a semiconductor device fabricated by using a conventional double hard mask.

As shown, a gate insulation layer 22 is formed on a substrate 21, and a polymetal gate electrode formed by stacking sequentially a polysilicon layer 23, a tungsten nitride layer 24 and a tungsten layer 25 is deposited on the gate insulation layer 22. Thereafter, a double hard mask including a hard mask oxide layer 26 and a hard mask nitride layer 27 is formed on the polymetal gate electrode. At this time, the hard mask oxide layer 26 is formed through a thermal oxidation technique performed at a temperature of above about 400° C. or a chemical vapor deposition (CVD) technique. Herein, the hard mask oxide layer 26 is a buffer layer for buffering stress generated by the hard mask nitride layer 27.

Since the hard mask oxide layer 26 is deposited by using the thermal oxidation technique accompanying a high temperature thermal process or the CVD technique, it is difficult to apply the hard mask oxide layer 26 to a polymetal gate electrode structure, a polycide gate structure and a metal gate structure. For instance, with reference to FIG. 4, the deposition temperature of the thermal oxidation technique or the CVD technique for the hard mask oxide layer 26 is above about 400° C., and thus, the tungsten layer 25 is prone to an abnormal oxidation. Due to this abnormal oxidation, a parasitic oxide layer 28, e.g., a tungsten oxide (WO) layer, is formed on between the tungsten layer 25 and the hard mask oxide layer 26. Generally, it is known that the abnormal oxidation occurs when the tungsten layer reacts with a supplied gas containing oxygen at a temperature of above about 350° C. The abnormal oxidation further becomes a factor for decreasing amounts of tungsten within the tungsten layer, and thereby increasing a resistance of the gate electrode.

SUMMARY OF THE INVENTION

It is, therefore, an object of the present invention to provide a method for fabricating a gate electrode of a semiconductor device with a double hard mask capable of preventing an abnormal oxidation of a metal layer of the gate electrode and simultaneously suppressing stress generation.

In accordance with an aspect of the present invention, there is provided a method for fabricating a gate electrode of a semiconductor device, including the steps of: forming a gate insulation layer on a substrate; forming a gate layer structure containing at least a metal layer on the gate insulation layer; forming a hard mask oxide layer on the gate layer structure at a temperature lower than an oxidation temperature of the metal layer; forming a hard mask nitride layer on the hard mask oxide layer; patterning the hard mask oxide layer and the hard mask nitride layer as a double hard mask for forming the gate electrode; and forming the gate electrode by etching the gate layer structure with use of the double hard mask as an etch mask.

In accordance with another aspect of the present invention, there is also provided a method for fabricating a gate electrode of a semiconductor device, including the steps of: forming a gate insulation layer on a substrate; forming a gate layer structure including at least a metal layer on the gate insulation layer; forming a hard mask oxide layer on the gate layer structure at a temperature lower than an oxidation temperature of the metal layer; forming a triple hard mask by stacking a hard mask nitride layer and a hard mask conductive layer on the hard mask oxide layer; patterning the triple hard mask to be used for forming the gate electrode; and forming the gate electrode by etching the gate layer structure with use of the patterned triple hard mask as an etch mask.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, detailed descriptions on a method for fabricating a gate electrode with a double hard mask will be provided with reference to the accompanying drawings.

Particularly, for the application of the double hard mask having a hard mask oxide layer and a hard mask nitride layer, an approach of decreasing a deposition temperature for the hard mask oxide layer is suggested to prevent an abnormal oxidation of a metal layer of the gate electrode during the hard mask oxide layer deposition.

That is, instead of employing a conventional thermal oxidation technique or a chemical vapor deposition (CVD) technique for depositing the hard mask oxide layer, an atomic layer deposition (ALD) technique is employed due to its capability of proceeding the deposition in a low temperature.

Typically, the ALD technique includes a series of steps proceeding first by supplying a source gas to make the source gas chemically adsorbed to a surface of a substrate and then purging the remaining source gas. Afterwards, a reaction gas is supplied to a layer of chemically adsorbed source gas and reacts with the source gas so that an intended atomic layer is deposited. The remaining reaction gas is purged thereafter.

The ALD technique uses a surface reaction mechanism, which provides a more stable and uniform thin layer. Also, the ALD technique suppresses more effectively particle generation occurring due to a gas phase reaction than the CVD technique since the ALD technique supplies separately the source gas and the reaction gas in a specific order and purges sequentially these gases.

Figure 1A:
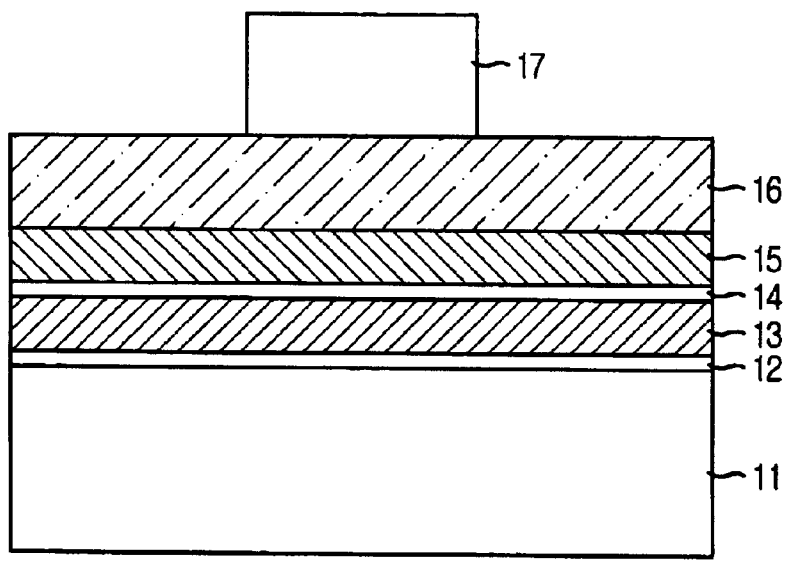
FIGS. 1A and 1B are cross-sectional views illustrating a conventional method for fabricating a gate electrode of a semiconductor device with a single hard mask.
Figure 1B:
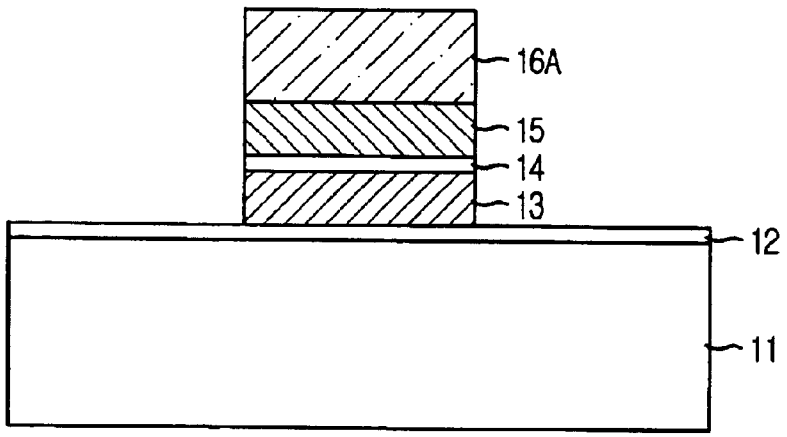
Figure 2:
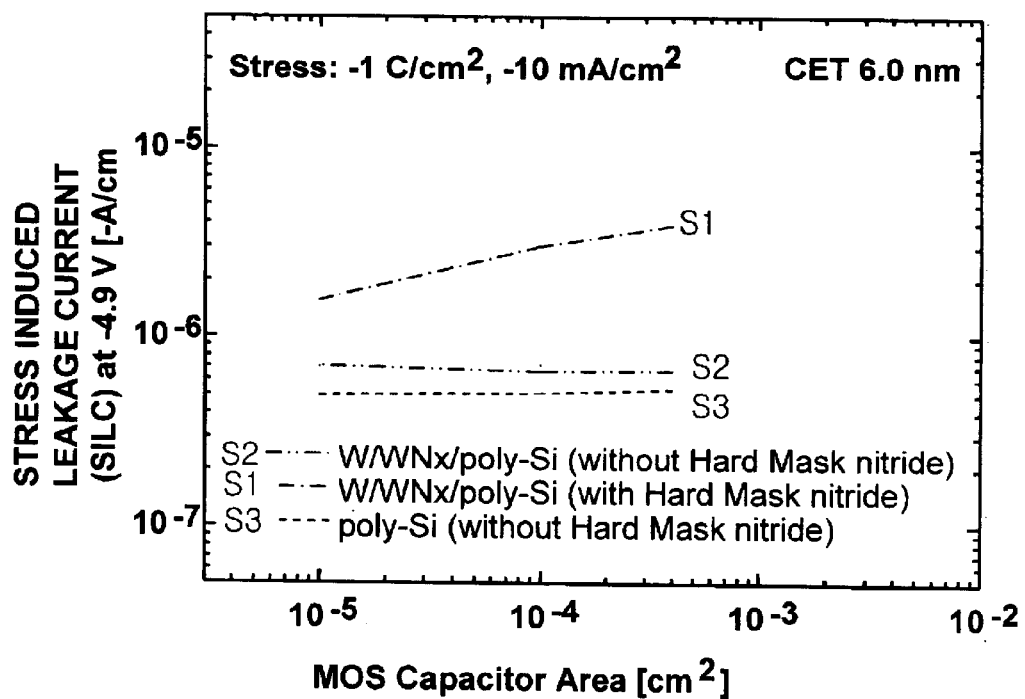
FIG. 2 is a diagram showing a comparison between stress induced leakage current (SILC) levels in the absence and the presence of a conventional hard mask nitride layer.
Figure 3:
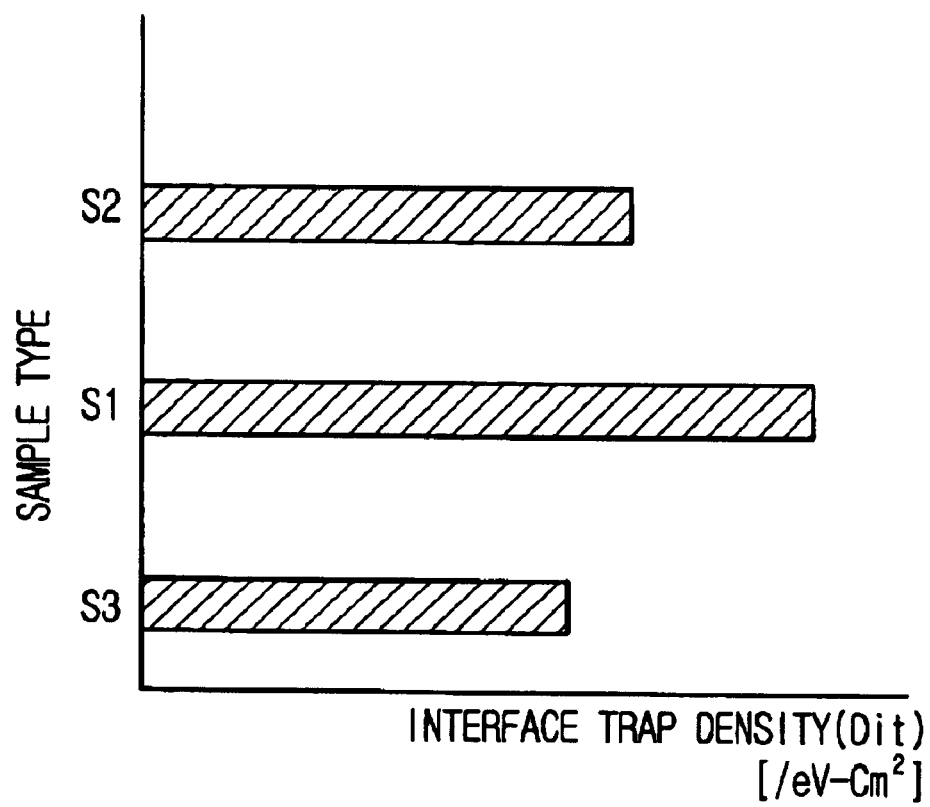
FIG. 3 is a diagram showing a comparison between interface trap densities of a first sample, a second sample and a third sample shown in FIG. 2.
Figure 4:
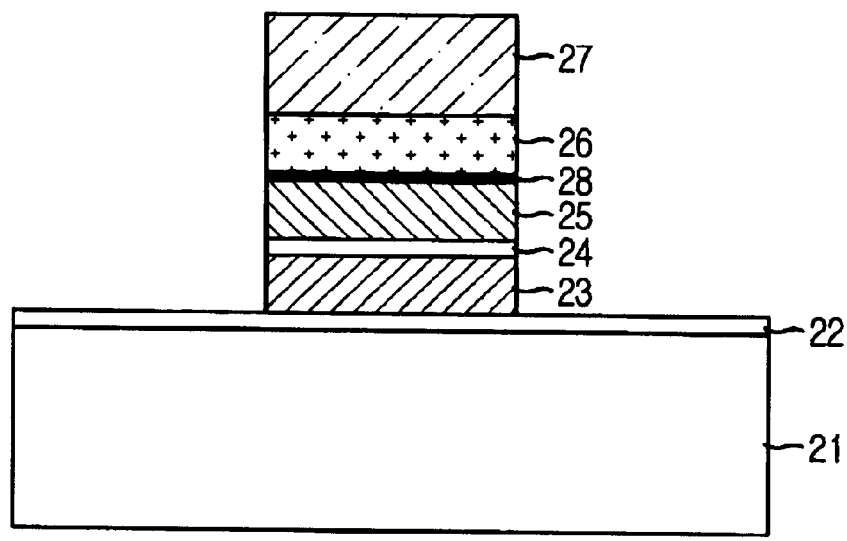
FIG. 4 is a cross-sectional view of a conventional semiconductor device with a double hard mask.
Figure 5:
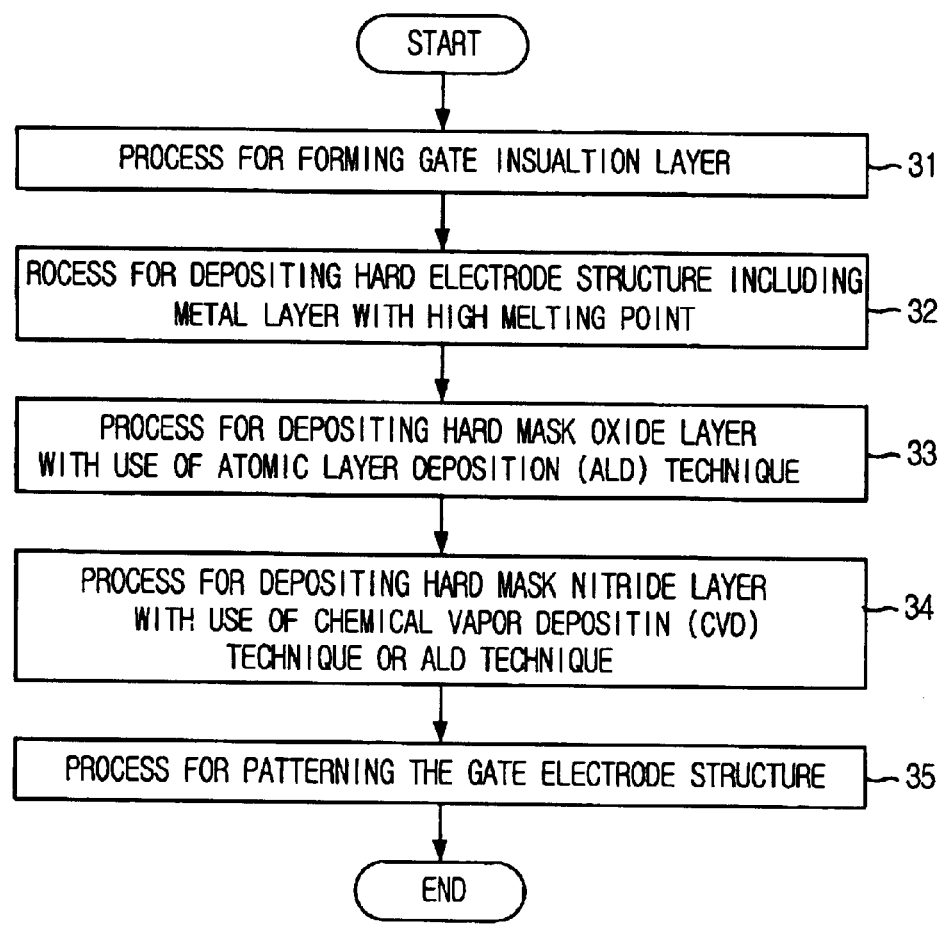
FIG. 5 is a flowchart showing sequential steps of a method for fabricating a gate electrode of a semiconductor device in accordance with the present invention.

FIG. 5 is a flowchart showing sequential steps of the above described method for fabricating the gate electrode in accordance with the present invention.

Referring to FIG. 5, the method for fabricating the gate electrode includes a series of processes; they are, a process 31 for forming a gate insulation layer, a process 32 for depositing a gate electrode including a metal layer with a high melting point, a process 33 for depositing a hard mask oxide layer by employing an ALD technique, a process 34 for depositing a hard mask nitride layer by using an ALD technique or a CVD technique and a process 35 for patterning the gate electrode. At this time, on the contrary to the thermal oxidation technique or the CVD technique performed at a temperature of above about 400° C., the ALD technique for depositing the hard mask oxide layer proceeds at a temperature of below about 350° C. Preferably, the deposition temperature of the ALD technique ranges from about 70° C. to about 350° C.

The use of ALD technique for depositing, the hard mask oxide layer on the metal layer of the gate electrode makes it possible to prevent the abnormal oxidation of the metal layer. Simultaneous to this effect, stress generation caused by the hard mask nitride layer is suppressed by forming the hard mask oxide layer on between the hard mask nitride layer and the gate electrode.

Figure 6A:
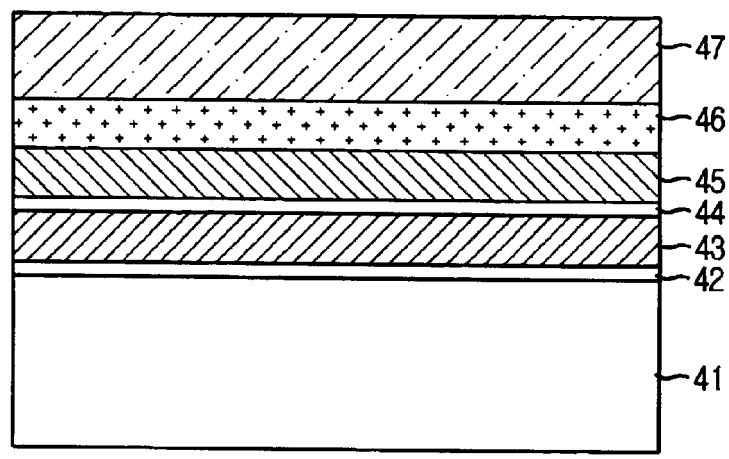
FIGS. 6A to 6C are cross-sectional views illustrating a method for fabricating a gate electrode of a semiconductor device in accordance with a first preferred embodiment of the present invention.
Figure 6B:
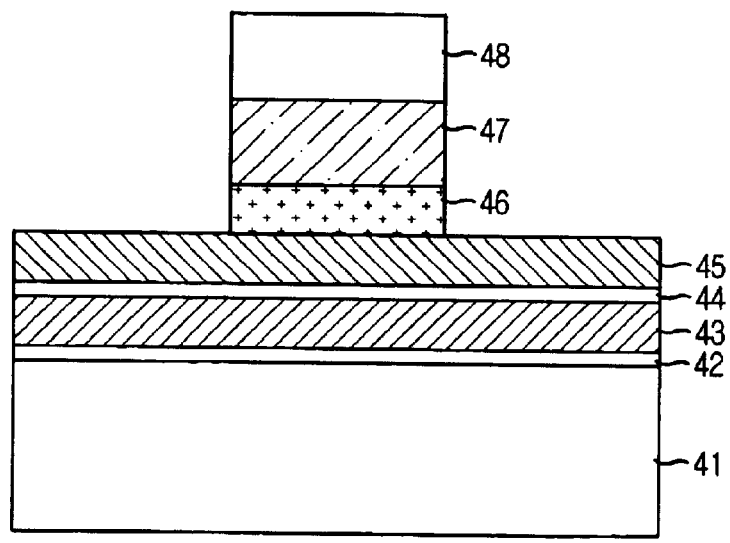
Figure 6C:
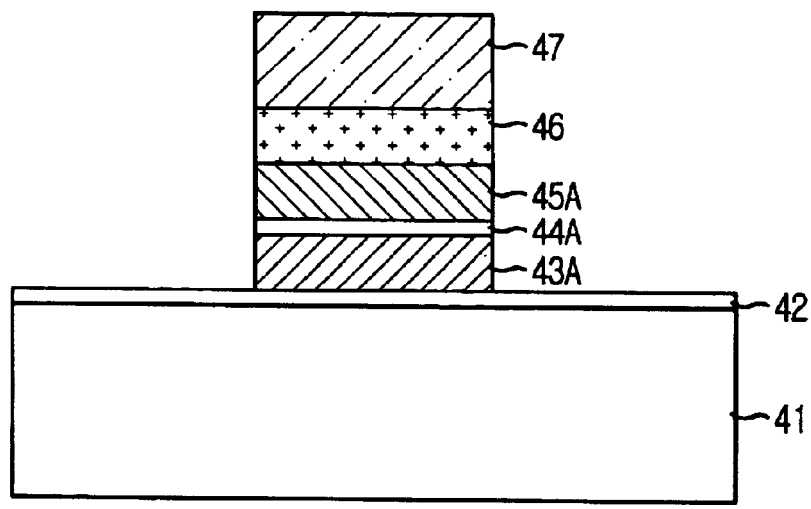

FIGS. 6A to 6C are cross-sectional views illustrating a method for fabricating a gate electrode in accordance with a first preferred embodiment of the present invention.

Referring to FIG. 6A, a gate insulation layer 42 is deposited on a silicon substrate 41, and a first gate layer 43, a diffusion barrier layer 44 and a second gate layer 45 are sequentially stacked on the gate insulation layer 42. At this time, the gate insulation layer 42 is a silicon oxide ($SiO_2$) layer formed by performing a thermal oxidation technique to the silicon substrate 41. The first gate layer 43 is made of polysilicon or polysilicon-germanium ($polySi_{1-x}Ge_x$), where x ranges from about 0.01 to about 0.99. The diffusion barrier layer 44, which is a barrier layer for preventing reciprocal diffusions between the first gate layer 43 and the second gate layer 45, is formed with a tungsten nitride layer (WN$_x$) with a thickness ranging from about 10 Å to about 300 Å or a silicon nitride layer (SiN$_x$) with a thickness ranging from about 5 Å to about 20 Å. Herein, the subscript x of the WN$_x$ representing an atomic ratio of nitrogen ranges from about 0.1 to about 2.0, while the subscript x of the SiN$_x$ representing an atomic ratio of nitrogen ranges from about 0.1 to about 2.0. Also, the second gate layer 45 being formed on the first gate layer 43 and the diffusion barrier layer 44 is made of tungsten (W) to form a polymetal gate structure.

Next, a hard mask oxide layer 46 is formed on the second gate layer 45 at a temperature ranging from about 70° C. to about 350° C. lower than a temperature of about 400° C. resulting in an oxidation of the second gate layer 45 made of tungsten. At this time, the hard mask oxide layer is deposited to a thickness ranging from about 10 Å to about 1000 Å by using an ALD technique. Also, the hard mask oxide layer 46 is made of a material selected from a group consisting of SiO$_2$, SiO$_x$N$_y$, where x and y range from about 0 to about 2.0 and from about 0 to about 1.0, respectively and SiO$_x$F$_y$, where x and y range from about 0 to about 2.0 and from about 0 to about 1.0, respectively. Also, the hard mask oxide layer 46 can be a dielectric layer with a high dielectric constant K made of a material selected from a group consisting of HfO$_2$, ZrO$_2$, Ta$_2$O$_5$, Al$_2$O$_3$, La$_2$O$_3$, Y$_2$O$_3$ and CeO$_2$.

For example, deposition of a SiO$_2$ layer as the hard mask oxide layer 46 by the ALD technique will be described in more detail. First, a source gas of silicon is supplied after being activated by using a radio frequency (RF) plasma or a microwave plasma and is then adsorbed onto the second gate layer 45. The remaining unadsorbed silicon source gas is purged thereafter. An oxidation gas is supplied thereto as a reaction gas so that the adsorbed silicon source gas chemically reacts with the oxidation gas, thereby forming the SiO$_2$ layer in unit of an atomic layer. After the chemical reaction, non-reacted oxidation gas and byproducts of the chemical reaction are purged. The SiO$_2$ layer deposition occurs at a temperature ranging from about 70° C. to about 350° C. with use of the ALD technique. Especially, the silicon source gas is selected from a group consisting of SiCl$_6$, SiCl$_4$, SiCl$_2$H$_2$, SiH$_4$, SiF$_4$ and SiF$_6$. The reaction gas is selected from a group consisting of O$_2$, O$_3$, H$_2$O, D$_2$O, NO and N$_2$O. Herein, the D represents deuterium. Also, it is possible to supply the silicon source gas, the oxidation gas and the purge gas after being activated by using a RF plasma or a microwave plasma.

As explained in the above, the abnormal oxidation of the second gate layer 45 is suppressed by using the ALD technique proceeding at the aforementioned low temperature for the hard mask oxide layer 45 deposition.

Despite this advantage, this lower deposition temperature causes the hard mask oxide layer 45 to be less dense, and impurities such as Cl or F contained in the silicon source gas still remain. These facts become a factor for degrading properties of the hard mask oxide layer 46. Thus, an annealing process is especially employed to increase the density of the hard mask oxide layer 46 and remove the remaining impurities. The annealing process is performed at a temperature ranging from about 400° C. to about 1000° C. in an atmosphere of N$_2$ gas, H$_2$ gas or a mixed gas of N$_2$ and H$_2$ for about 10 seconds to about 30 minutes. Even though the annealing temperature is high, a thermal budget exerted to the second gate layer 45 is suppressed since the hard mask oxide layer 46 is already formed. Also, the tungsten layer, i.e., the second gate layer 45, is not oxidated since the annealing proceeds in the N$_2$ or H$_2$ atmosphere.

Subsequent to the deposition of the hard mask oxide layer 46, a hard mask nitride layer 47 is deposited through the use of a chemical vapor deposition (CVD) technique or an ALD technique. At this time, the hard mask nitride layer 47 is deposited to a thickness ranging from about 500 Å to about 5000 Å. Particularly, the hard mask nitride layer 47 is a silicon nitride layer made of Si$_3$N$_4$. Herein, in case of the deposition temperature of the hard mask nitride layer 47 is above about 600° C., an additional annealing process as described above can be omitted.

Referring to FIG. 6B, a photosensitive pattern 48 for patterning the gate electrode is formed on the hard mask nitride layer 47. Then, the hard mask nitride layer 47 and the hard mask oxide layer 46 are sequentially patterned by using the photosensitive pattern 48 as an etch mask.

The patterned hard mask oxide layer 46 and the hard mask nitride layer 47 forms a double hard mask structure being used as an etch mask when the gate electrode is patterned. The use of double hard mask decreases the thickness of the photosensitive pattern 48 during formation of a highly integrated semiconductor device.

Referring to FIG. 6C, the photosensitive pattern 48 is removed. Then, the second gate layer 45, the diffusion barrier layer 44 and the first gate layer 43 are sequentially patterned by using the above double hard mask as an etch mask. From this patterning with use of the double hard mask, a polymetal gate structure including a patterned first gate layer 43A, a patterned diffusion barrier layer 44A and a patterned second gate layer 45A is formed.

Based on the first preferred embodiment of the present invention, the double hard mask including the hard mask oxide layer 46 and the hard mask nitride layer 47 makes an ease of the patterning process for forming the polymetal gate structure and simultaneously prevents a degradation of hard mask layer properties caused by stress generated when the single hard mask is used. Also, since the hard mask oxide layer 46 is deposited at a low temperature, it is possible to prevent the abnormal oxidation of the second gate layer 45 of the polymetal gate structure.

Figure 7:
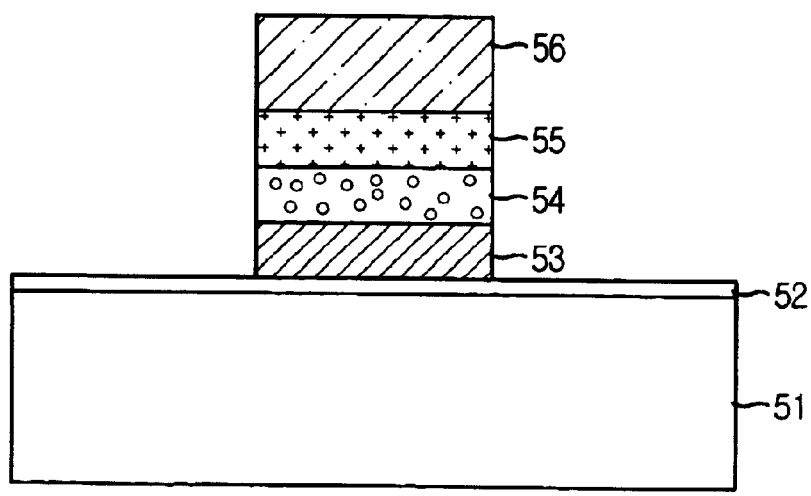
FIG. 7 is a cross-sectional view of a gate electrode of a semiconductor device fabricated in accordance with a second preferred embodiment of the present invention.

FIG. 7 is a cross-sectional view of a gate electrode of a semiconductor device fabricated in accordance with a second preferred embodiment of the present invention.

Referring to FIG. 7, a gate insulation layer 52 is formed on a silicon substrate 51, and a polycide gate structure including a first gate layer 53 and a second gate layer 54 is formed thereon. Then, a hard mask oxide layer 55 and a hard mask nitride layer 56 are formed on the polycide gate structure, forming a double hard mask.

More specifically, the gate insulation layer 52 is a SiO$_2$ layer formed by performing a thermal oxidation technique to the silicon substrate 51. The first gate layer 53 is a polysilicon layer or a polysilicon-germanium layer (PolySi$_{1-x}$Ge$_x$), where x ranges from about 0.01 to about 0.99. Also, the second gate layer 54 is a silicide layer made of a material selected from a group consisting of tungsten silicide (WSi$_x$), cobalt silicide (CoSi$_x$), nickel silicide (NiSi$_x$), chromium silicide (CrSi$_x$) and titanium silicide (TiSi$_x$). Herein, each subscript x representing a silicon atomic ratio ranges from about 1 to about 3. Also, the hard mask oxide layer 55 is made of a material selected from a group consisting of SiO$_2$, SiO$_x$N$_y$, where x and y range from about 0 to about 2.0 and from about 0 to about 1.0, respectively and SiO$_x$F$_y$, where x and y range from about 0 to about 2.0 and from about 0 to about 1.0, respectively. Also, the hard mask oxide layer 55 can be a dielectric layer with a high dielectric constant K made of a material selected from a group consisting of HfO$_2$, ZrO$_2$, Ta$_2$O$_5$, Al$_2$O$_3$, La$_2$O$_3$, Y$_2$O$_3$ and CeO$_2$.

For instance, the silicon source gas for forming the $SiO_2$ layer with use of the ALD technique uses a gas containing silicon selected from a group consisting of $SiCl_6$, $SiCl_4$, $SiCl_2H_2$, $SiH_4$, $SiF_4$ and $SiF_6$. The reaction gas is selected from a group consisting of $O_2$, $O_3$, $H_2O$, $D_2O$, NO and $N_2O$. Also, it is possible to supply the silicon source gas, the oxidation gas and the purge gas after being activated by using a RF plasma or a microwave plasma.

In the mean time, the hard mask oxide layer 55 is subjected to an annealing process performed at a temperature ranging from about 400° C. to about 1000° C. in an atmosphere of $N_2$ gas, $H_2$ gas or a mixed gas of $N_2$ and $H_2$ for about 10 seconds to about 30 minutes to increase the density of the hard mask oxide layer 55 and remove the remnant impurities remaining in the hard mask oxide layer 55.

The hard mask nitride layer 56 is deposited to a thickness in a range from about 500 Å to about 5000 Å by using a CVD technique or an ALD technique. The hard mask nitride layer 56 is a silicon nitride layer made of $Si_3N_4$. In case that the deposition temperature of the hard mask nitride layer 56 is above about 600° C., an additional annealing process can be omitted after the formation of the hard mask oxide layer 55.

Figure 8:
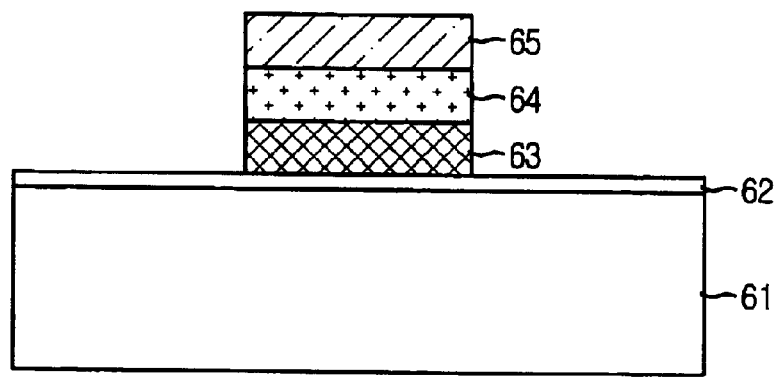
FIG. 8 is a cross-sectional view of a gate electrode of a semiconductor in accordance with a third preferred embodiment of the present invention.

FIG. 8 is a cross-sectional view of a gate electrode of a semiconductor device fabricated in accordance with a third preferred embodiment of the present invention.

As shown, a gate insulation layer 62 is formed on a silicon substrate 61, and a metal gate structure including a metal layer 63 is formed thereon. Then, a double hard mask structure including a hard mask oxide layer 64 and a hard mask nitride layer 65 is formed on the metal gate structure.

The gate insulation layer 62 is a $SiO_2$ layer formed by performing a thermal oxidation technique to the silicon substrate 61. The metal layer 63 is made of a material selected from a group consisting of TaN, TaSiN, TiN, TiAlN and HfN. Herein, the reason for using the metal layer containing nitrogen is to prevent the metal layer 63 from reacting with the gate insulation layer 62.

The hard mask oxide layer 64 is formed by using an ALD technique performed at a temperature ranging from about 70° C. to about 350° C. Also, the hard mask oxide layer 64 is made of a material selected from a group consisting of $SiO_2$, $SiO_xN_y$, where x and y range from about 0 to about 2.0 and from about 0 to about 1.0, respectively and $SiO_xF_y$, where x and y range from about 0 to about 2.0 and from about 0 to about 1.0, respectively. Also, the hard mask oxide layer 64 can be a dielectric layer with a high dielectric constant K made of a material selected from a group consisting of $HfO_2$, $ZrO_2$, $Ta_2O_5$, $Al_2O_3$, $La_2O_3$, $Y_2O_3$ and $CeO_2$.

For instance, the silicon source gas for forming the $SiO_2$ layer by employing the ALD technique uses a gas containing silicon selected from a group consisting of $SiCl_6$, $SiCl_4$, $SiCl_2H_2$, $SiH_4$, $SiF_4$ and $SiF_6$. The reaction gas is selected from a group consisting of $O_2$, $O_3$, $H_2O$, $D_2O$, NO and $N_2O$. Also, it is possible to supply the silicon source gas, the oxidation gas and the purge gas after being activated by using one of RF plasma and microwave plasma.

In the mean time, the hard mask oxide layer 64 is subjected to an annealing process performed at a temperature ranging from about 400° C. to about 1000° C. in an atmosphere of $N_2$ gas, $H_2$ gas or a mixed gas of $N_2$ and $H_2$ for about 10 seconds to about 30 minutes to increase the density of the hard mask oxide layer 64 and remove the remnant impurities remaining in the hard mask oxide layer 64.

The hard mask nitride layer 65 is deposited to a thickness in a range from about 500 Å to about 5000 Å by using a CVD technique or an ALD technique. The hard mask nitride layer 65 is a silicon nitride layer made of $Si_3N_4$. In case that the deposition temperature of the hard mask nitride layer 65 is above about 600° C., an additional annealing process can be omitted after the formation of the hard mask oxide layer 64.

According to the preferred embodiments of the present invention, a double hard mask structure including the hard mask oxide layer and the hard mask nitride layer makes an ease of a patterning process of the polycide gate structure and the metal gate structure and simultaneously prevents properties of the hard mask layers from being degraded by stress usually generated when a single hard mask nitride layer is used. Since the hard mask oxide layer formed on the polycide gate structure or the metal gate structure is deposited at a low temperature, it is also possible to prevent the silicide layer of the polycide gate structure or the metal layer of the metal gate structure from being abnormally oxidized.

Figure 9:
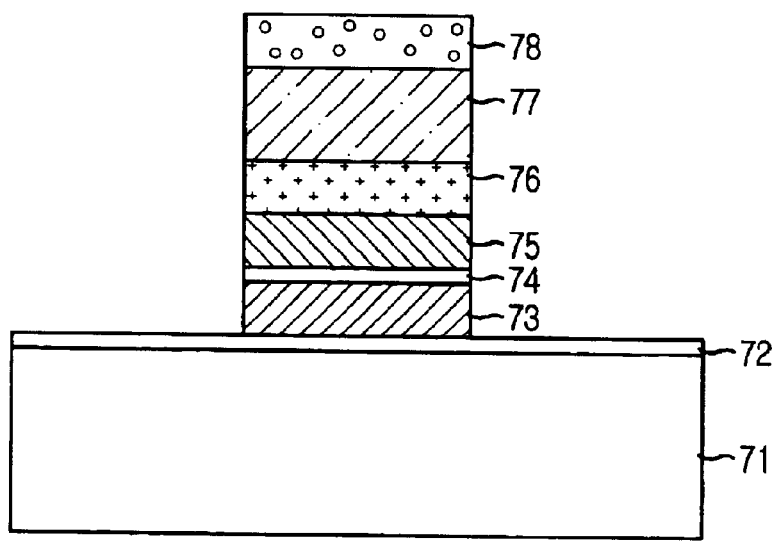
FIG. 9 is a cross-sectional view of a gate electrode of a semiconductor device fabricated in accordance with a fourth preferred embodiment of the present invention.

FIG. 9 is a cross-sectional view of a gate electrode of a semiconductor device fabricated in accordance with a fourth preferred embodiment of the present invention.

As shown, a gate insulation layer 72 is formed on a silicon substrate 71, and a polymetal gate structure including a first gate layer 73, a diffusion barrier layer 74 and a second gate layer 75 is formed on the gate insulation layer 72. Also, a triple hard mask including a hard mask oxide layer 76, a hard mask nitride layer 77 and a hard mask conductive layer 78 is formed on the polymetal gate structure.

Particularly, the gate insulation layer 72 is a $SiO_2$ layer formed by performing a thermal oxidation technique to the silicon substrate 71. The first gate layer 73 is made of polysilicon or polysilicon-germanium ($polySi_{1-x}Ge_x$), where x ranges from about 0.01 to about 0.99. The diffusion barrier layer 74, which is a barrier layer for preventing reciprocal diffusions between the first gate layer 73 and the second gate layer 75, is formed with a tungsten nitride layer ($WN_x$) with a thickness ranging from about 10 Å to about 300 Å or a silicon nitride layer ($SiN_x$) with a thickness ranging from about 5 Å to about 20 Å. Herein, the subscript x of the $WN_x$ representing an atomic ratio of nitrogen ranges from about 0.1 to about 2.0, while the subscript x of the $SiN_x$ representing an atomic ratio of nitrogen ranges from about 0.1 to about 2.0. Also, the second gate layer 75 formed on the first gate layer 73 and the diffusion barrier layer 74 is made of tungsten to form the polymetal gate structure.

Also, the hard mask oxide layer 76 is formed by using an ALD technique performed at a temperature ranging from about 70° C. to about 350° C. Also, the hard mask oxide layer 76 is made of a material selected from a group consisting of $SiO_2$, $SiO_xN_y$, where x and y range from about 0 to about 2.0 and from about 0 to about 1.0, respectively and $SiO_xF_y$, where x and y range from about 0 to about 2.0 and from about 0 to about 1.0, respectively. Also, the hard mask oxide layer 76 can be a dielectric layer with a high dielectric constant K made of a material selected from a group consisting of $HfO_2$, $ZrO_2$, $Ta_2O_5$, $Al_2O_3$, $La_2O_3$, $Y_2O_3$ and $CeO_2$.

For instance, the silicon source gas for forming the $SiO_2$ layer by employing the ALD technique uses a gas containing silicon selected from a group consisting of $SiCl_6$, $SiCl_4$, $SiCl_2H_2$, $SiH_4$, $SiF_4$ and $SiF_6$. The reaction gas is selected from a group consisting of $O_2$, $O_3$, $H_2O$, $D_2O$, NO and $N_2O$. Also, it is possible to supply the silicon source gas, the oxidation gas and the purge gas after being activated by using a RF plasma or a microwave plasma.

In the mean time, the hard mask oxide layer 76 is subjected to an annealing process performed at a temperature ranging from about 400° C. to about 1000° C. in an atmosphere of $N_2$ gas, $H_2$ gas or a mixed gas of $N_2$ and $H_2$ for about 10 seconds to about 30 minutes to increase the density of the hard mask oxide layer 76 and remove the remnant impurities remaining in the hard mask oxide layer 76. This annealing process is additionally performed in case that the deposition temperature of the hard mask nitride layer 77 is below about 600° C.

The hard mask nitride layer 77 is deposited to a thickness in a range from about 500 Å to about 5000 Å by using a CVD technique or an ALD technique. The hard mask nitride layer 77 is a silicon nitride layer made of $Si_3N_4$. The hard mask conductive layer 78 is deposited to make more easily the second gate layer 75 be patterned than the double hard mask structure including the hard mask oxide layer 76 and the hard mask nitride layer 77. The hard mask conductive layer 78 is made of W and $WN_x$, where x ranges from about 0.01 to about 2.0. Herein, the hard mask conductive layer 78 does not remain on the double hard mask structure after the patterning process. In other words, it is removed.

Although the fourth preferred embodiment of the present invention exemplifies a case of employing the triple hard mask in the polymetal gate structure, the triple hard mask structure can be still applied to the polycide gate structure or to the metal gate structure.

As a fifth preferred embodiment of the present invention, it is possible to adopt a triple structure of hard mask nitride layer/hard mask oxide layer/hard mask nitride layer. At this time, the hard mask nitride layer beneath the hard mask oxide layer has a thickness in a range from about 10 Å to about 200 Å. This level of thickness is a thickness preventing oxidation of the tungsten layer. If the hard mask nitride layer is deposited with a thin thickness prior to depositing the hard mask oxide layer, it is possible to suppress potential oxygen diffusions into the tungsten layer.

Based on the first to the fifth preferred embodiments of the present invention, it is possible to prevent an abnormal oxidation of the gate electrode by forming the hard mask oxide layer directly contacting to the gate electrode at a low temperature of below about 350° C.

For patterning the polymetal gate structure applied to a device with below about 90 nm, particularly, a gate electrode sequentially stacked of the polysilicon layer, the tungsten nitride layer and the tungsten layer, a double hard mask can be used to reduce stress exerted to the gate electrode and to thereby improve reliability of transistor operation. As a result of this improvement on the reliability, it is further possible to enhance a refresh function and increase yields of semiconductor devices.

While the present invention has been described with respect to certain preferred embodiments, it will be apparent to those skilled in the art that various changes and modifications may be made without departing from the scope of the invention as defined in the following claims.

What is claimed is:

1. A method for fabricating a gate electrode of a semiconductor device, comprising the steps of:
    forming a gate insulation layer on a substrate;
    forming a gate layer structure containing at least a metal layer on the gate insulation layer;
    forming a hard mask oxide layer on the gate layer structure at a temperature lower than an oxidation temperature of the metal layer, wherein the hard mask oxide layer is obtained by performing an atomic layer deposition (ALD) technique at a temperature ranging from about 70° C. to about 350° C.;
    forming a hard mask nitride layer on the hard mask oxide layer;
    patterning the hard mask oxide layer and the hard mask nitride layer as a double hard mask for forming the gate electrode; and
    forming the gate electrode by etching the gate layer structure with use of the double hard mask as an etch mask.

2. The method as recited in claim 1, wherein the step of forming the hard mask oxide layer includes the step of performing an annealing process for densifying the hard mask oxide layer and removing remnant impurities.

3. The method as recited in claim 2, wherein the annealing process is performed at a temperature ranging from about 400° C. to about 1000° C. in an atmosphere of $N_2$ gas, $H_2$ gas or a mixed gas of $N_2$ and $H_2$ for about 10 seconds to about 30 minutes.

4. The method as recited in claim 1, wherein the hard mask oxide layer is made of a material selected from a group consisting of $SiO_2$, $SiO_xN_y$, where x and y representing atomic ratios of oxygen and nitrogen range from about 0 to about 2.0 and from about 0 to about 1.0, respectively and $SiO_xF_y$, where x and y representing atomic ratios of oxygen and fluorine range from about 0 to about 2.0 and from about 0 to about 1.0, respectively or a group consisting of $HfO_2$, $ZrO_2$, $Ta_2O_5$, $Al_2O_3$, $La_2O_3$, $Y_2O_3$ and $CeO_2$.

5. The method as recited in claim 1, wherein the hard mask oxide layer has a thickness ranging from about 10 Å to about 1000 Å.

6. The method as recited in claim 1, wherein the gate layer structure is a structure selected from a stack structure of a metal layer, a diffusion barrier layer and a polysilicon layer, a stack structure of a silicide layer and a polysilicon layer, a stack structure of a metal layer, a diffusion barrier layer and a polysilicon-germanium layer and a single metal structure containing only a metal layer.

7. A method for fabricating a gate electrode of a semiconductor device, comprising the steps of:
    forming a gate insulation layer on a substrate;
    forming a gate layer structure including at least a metal layer on the gate insulation layer;
    forming a hard mask oxide layer on the gate layer structure at a temperature lower than an oxidation temperature of the metal layer;
    forming a triple hard mask by stacking a hard mask nitride layer and a hard mask conductive layer on the hard mask oxide layer;
    patterning the triple hard mask to be used for forming the gate electrode; and
    forming the gate electrode by etching the gate layer structure with use of the patterned triple hard mask as an etch mask.

8. The method as recited in claim 8, wherein the step of forming the hard mask oxide layer proceeds by performing an ALD technique at a temperature ranging from about 70° C. to about 350° C.

9. The method as recited in claim 7, wherein the step of forming the hard mask oxide layer includes the step of performing an annealing process for densifying the hard mask oxide layer and removing remnant impurities.

10. The method as recited in claim 9, wherein the step of performing the annealing process is performed at a temperature ranging from about 400° C. to about 1000° C. in an atmosphere of $N_2$ gas, $H_2$ gas or a mixed gas of $N_2$ and $H_2$ for about 10 seconds to about 30 minutes.

11. The method as recited in claim 7, wherein the hard mask oxide layer is made of a material selected from a group consisting of $SiO_2$, $SiO_xN_y$, where x and y representing atomic ratios of oxygen and nitrogen range from about 0 to about 2.0 and from about 0 to about 1.0, respectively and $SiO_xF_y$, where x and y representing atomic ratios of oxygen and fluorine range from about 0 to about 2.0 and from about 0 to about 1.0, respectively or a group consisting of $HfO_2$, $ZrO_2$, $Ta_2O_5$, $Al_2O_3$, $La_2O_3$, $Y_2O_3$ and $CeO_2$.

12. The method as recited in claim 7, wherein the hard mask oxide layer has a thickness ranging from about 10 Å to about 1000 Å.

13. The method as recited in claim 7, wherein the gate layer structure is a structure selected from a stack structure of a metal layer, a diffusion barrier layer and a polysilicon layer, a stack structure of a silicide layer and a polysilicon layer, a stack structure of a metal layer, a diffusion barrier layer and a polysilicon-germanium layer, a stack structure of a silicide layer and a polysilicon germanium layer and a single metal structure containing only a metal layer.

14. The method as recited in claim 7, wherein the hard mask conductive layer is a tungsten layer or a tungsten nitride layer.

* * * * *